United States Patent [19]
Yoshida

[11] Patent Number: 6,093,598
[45] Date of Patent: Jul. 25, 2000

[54] PROCESS FOR EXACTLY TRANSFERRING LATENT IMAGES IN PHOTO-RESIST LAYER NONUNIFORM IN THICKNESS IN FABRICATION OF SEMICONDUCTOR INTEGRATED CIRCUIT DEVICE

[75] Inventor: Naoyuki Yoshida, Tokyo, Japan

[73] Assignee: NEC Corporation, Japan

[21] Appl. No.: 09/206,193

[22] Filed: Dec. 4, 1998

[30] Foreign Application Priority Data

Dec. 4, 1997 [JP] Japan ................................. 9-334390

[51] Int. Cl.[7] ................................................ H01L 21/8234
[52] U.S. Cl. .......................... 438/238; 438/364; 438/400; 438/396
[58] Field of Search .................................... 438/238, 364, 438/400, 396

[56] References Cited

U.S. PATENT DOCUMENTS

4,711,699  12/1987  Amano ........................................ 437/52
4,800,177  1/1989  Nakamae ................................. 437/193

*Primary Examiner*—Richard Elms
*Assistant Examiner*—Pho Luu
*Attorney, Agent, or Firm*—Hayes, Soloway, Hennessey, Grossman & Hage, P.C.

[57] ABSTRACT

A semiconductor stacked type dynamic random access memory device has a node contact hole formed in an inter-level insulating layer and a storage electrode held in contact with a source region of an access transistor through the node contact hole, and the node contact hole and the storage electrode are patterned by using a photo-lithography and an etching, wherein a photo-resist mask for the node contact hole is different in thickness from a photo-resist mask for the storage electrode by value equivalent to a half of the period of the periodicity representative of sensitized characteristics of the photo-resist in the presence of an optical standing wave in the photo-resist masks, thereby keeping the nesting tolerance between the two patterns.

8 Claims, 6 Drawing Sheets

PROCESS FOR EXACTLY TRANSFERRING LATENT IMAGES IN PHOTO-RESIST LAYER NONUNIFORM IN THICKNESS IN FABRICATION OF SEMICONDUCTOR INTEGRATED CIRCUIT DEVICE

FIELD OF THE INVENTION

This invention relates to a fabrication technology for a semiconductor integrated circuit device and, more particularly, to a process for exactly transferring latent images in a photo-resist layer non-uniform in thickness during fabrication of a semiconductor integrated circuit device such as, for example, a semiconductor dynamic random access memory device.

DESCRIPTION OF THE RELATED ART

Figure 1A:
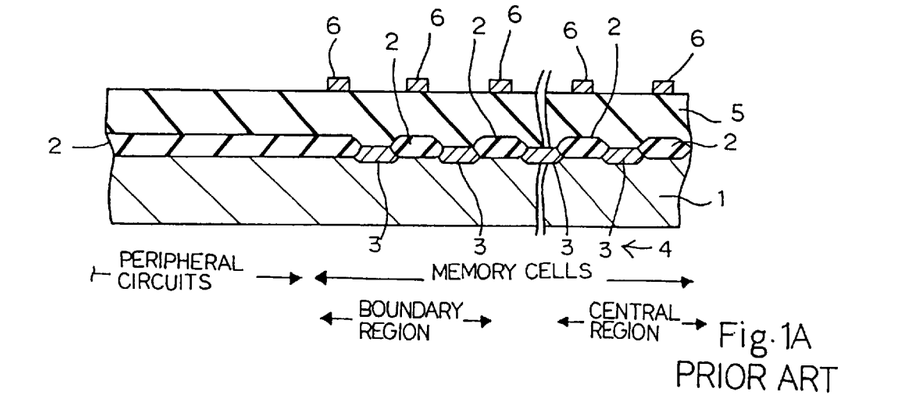
FIGS. 1A to 1C are cross sectional views showing the prior art process for fabricating a semiconductor dynamic random access memory device.
Figure 1B:
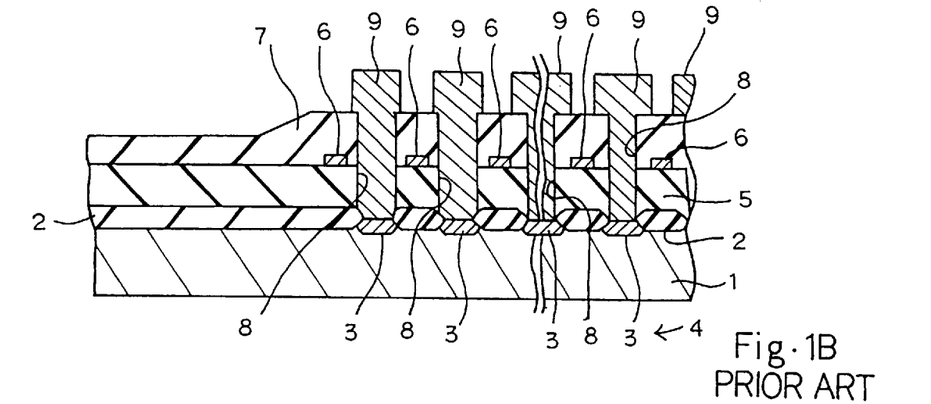
Figure 1C:
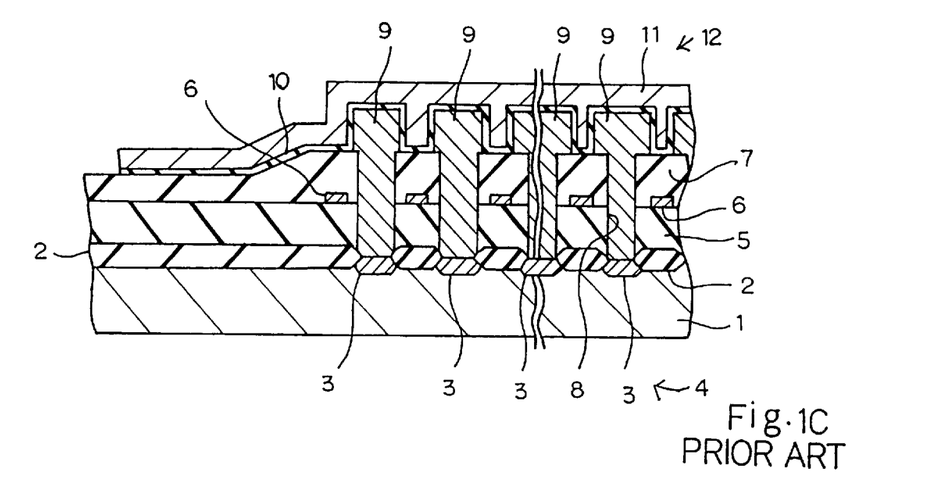

FIGS. 1A to 1C illustrate a typical example of the fabrication process for a semiconductor dynamic random access memory device. The prior art process starts with preparation of a p-type silicon substrate 1. A field oxide layer 2 is selectively grown to 400 nanometers thick on the major surface of the p-type silicon substrate 1, and defines active areas. The active areas are selectively assigned to memory cells and circuit components of peripheral circuits. The active areas assigned to the memory cells are shown in FIGS. 1A to 1C.

The active areas assigned to the memory cells are thermally oxidized, and gate oxide layers are grown on the active areas. Gate electrodes are patterned on the gate oxide layers, and n-type dopant impurity is ion implanted into the active areas so as to form a pair of source regions 3 and a drain region in each active area. FIGS. 1A to 1C show semiconductor structures at different steps along a cross section perpendicular to the source region. For this reason, the gate oxide layer, the gate electrode and the drain region are not shown in FIGS. 1A to 1C. The gate oxide layer, the gate electrode, the source region 3 and the drain region as a whole constitute an n-channel enhancement type access transistor 4 of each memory cell.

Subsequently, boro-phospho-silicate glass is deposited to 500 nanometers thick over the entire surface of the resultant semiconductor structure, and bit contact holes (not shown) are formed in the boro-phospho-silicate glass layer 5 by using photo-lithographic techniques and an etching. The drain regions are exposed to the bit contact holes, respectively. Tungsten silicide is deposited over the entire surface of the resultant semiconductor structure. The tungsten silicide fills the bit contact holes, and forms a tungsten silicide layer of 200 nanometers thick on the boro-phospho-silicate glass layer 5. The tungsten silicide layer is selectively etched away, and bit lines 6 are patterned on the boro-phospho-silicate glass layer 5 as shown in FIG. 1A.

Subsequently, boro-phospho-silicate glass is deposited over the entire surface of the resultant semiconductor structure, and forms a boro-phospho-silicate glass layer 7 of 500 nanometers thick. Using the photo-lithographic techniques and the etching, node contact holes 8 are formed in the boro-phospho-silicate glass layers 5/7, and the source regions 3 are exposed to the node contact holes 8. In this instance, the node contact holes 8 are 0.4 micron in diameter.

Subsequently, polysilicon is deposited over the entire surface of the resultant semiconductor structure. The polysilicon fills the node contact holes 8, and forms a polysilicon layer of 500 nanometers thick over the boro-phospho-silicate glass layer 7. Using the photo-lithographic techniques and the etching, the polysilicon layer is patterned into storage electrodes 9 as shown in FIG. 1B. The storage electrodes 9 are held in contact with the source regions 3 of the n-channel enhancement type access transistors 4.

Subsequently, silicon nitride is deposited to 7 nanometers thick over the entire surface of the resultant semiconductor structure, and the storage electrodes 9 are covered with dielectric layers 10 of the silicon nitride.

Finally, polysilicon is deposited to 200 nanometers thick over the entire surface of the resultant semiconductor structure, and forms a polysilicon layer. The polysilicon layer is pattered by using the photo-lithographic techniques and the etching, and a counter electrode 11 is left on the dielectric layers 10. The storage electrode 9, the dielectric layer 10 and the counter electrode 11 form in combination each stacked capacitor 12.

Figure 2A:
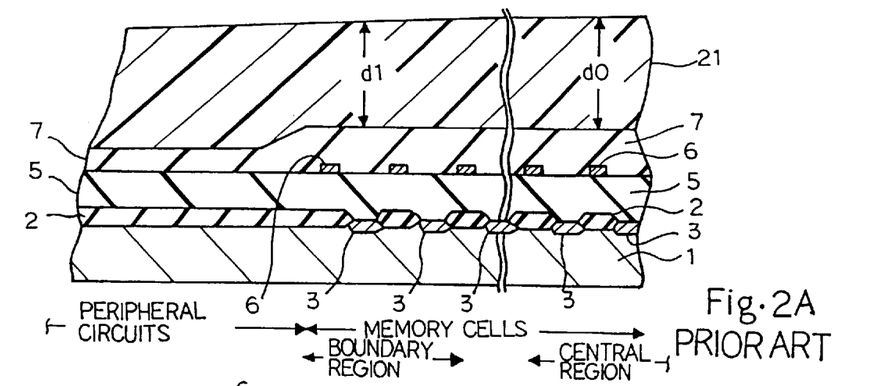
FIGS. 2A to 2D are cross sectional views showing the step of forming node contact holes and the step of forming storage node electrodes both incorporated in the prior art process.

Description is hereinbelow made on the step of forming the storage node contacts 8 and the step of forming the storage electrodes 9 with reference to FIGS. 2A to 2D. After the deposition of the boro-phospho-silicate glass layer 7, photo-resist solution is spun onto the boro-phospho-silicate glass layer 7, and is baked so that the boro-phospho-silicate glass layer 21 is covered with a photo-resist layer 21 as shown in FIG. 2A. The average thickness of the photo-resist layer 21 is 1 micron. However, the thickness of the photo-resist layer 21 is not constant. The photo-resist layer 21 over the central region is thicker than the photo-resist layer 21 over the boundary region. In fact, there is a difference between the thickness d0 over the central region and the thickness d1 over the boundary region, and the thickness d0 is 20 nanometers greater than the thickness d1.

Figures 2B, 2C:
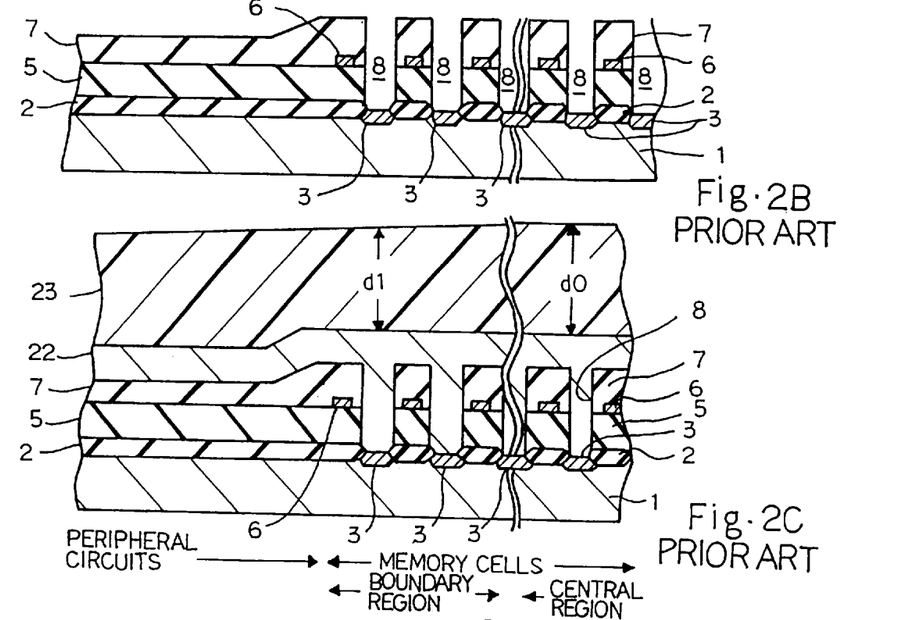

The p-type silicon substrate 1 is placed on a x-y stage of an aligner (not shown), and is exposed to optical radiation through a photo mask (not shown). A pattern image for the node contact holes 8 are transferred from the photo-mask to the photo-resist layer 21, and a latent image for the node contact holes 8 is formed in the photo-resist layer 21. The latent image is developed, and the photo-resist layer 21 is patterned into a photo-resist etching mask (not shown) through the development. Using the photo-resist etching mask, the boro-phospho-silicate glass layers 7/5 are selectively etched away, and the node contact holes 8 are formed in the boro-phospho-silicate glass layers 5/7 as shown in FIG. 2B. Thus, the photo-resist etching mask is formed through the photo-lithographic techniques, and the node contact holes 8 are formed by using the etching technique.

The photo-lithographic techniques and the etching technique are also required for the storage electrodes 9. The polysilicon is deposited over the entire surface of the resultant semiconductor structure shown in FIG. 2B. The polysilicon fills the node contact holes 8, and forms the polysilicon layer 22 of 500 nanometers thick. Photo-resist solution is spun onto the polysilicon layer 22, and is baked so that a photo-resist layer 23 of 1 micron thick covers the polysilicon layer 22 as shown in FIG. 2C.

The thickness of the photo-resist layer 23 is also not constant. The photo-resist layer 23 over the central region is thicker than the photo-resist layer 23 over the boundary region. The thickness d0 over the central region is 20 nanometers greater than the thickness d1 over the boundary region. The non-uniform photo-resist layers 21/23 are due to the poor step coverage between the boro-phospho-silicate glass layer 7 over the peripheral circuits and the boro-phospho-silicate glass layer 7 over the memory cells.

Figure 2D:
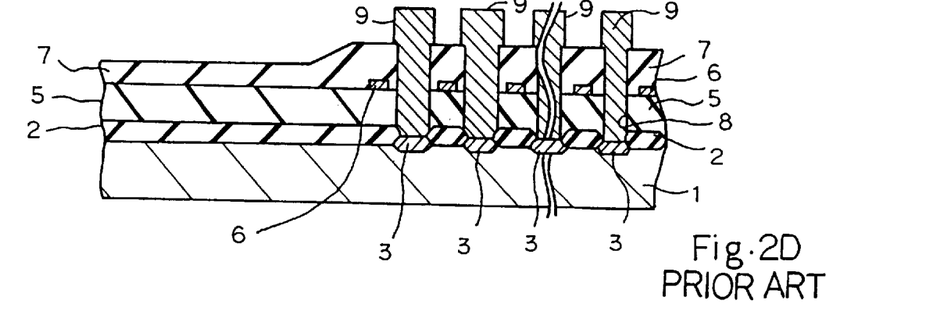

The p-type silicon substrate 1 is placed on the x-y stage of the aligner (not shown), and is exposed to optical radiation through a photo mask (not shown). A pattern image for the storage electrodes 9 are transferred from the photo-mask to the photo-resist layer 23, and a latent image for the storage electrodes 9 is formed in the photo-resist layer 23. The latent image is developed, and the photo-resist layer 23 is patterned into a photo-resist etching mask (not shown) through the development. Using the photo-resist etching mask, the polysilicon layer 22 is selectively etched away, and the storage electrodes 9 are formed on the boro-phospho-silicate glass layer 7 as shown in FIG. 2D. Thus, the photo-resist etching mask is formed through the photo-lithographic techniques, and the storage electrodes 9 are formed by using the etching technique.

While the optical ray is transferring the pattern image from the photo-mask to the photo-resist layer 21/23, the optical ray is incident on the upper surface of the photo-resist layer, and is propagated through the photo-resist layer to the boundary between the photo-resist layer 21/23 and the boro-phospho-silicate glass/polysilicon layer 7/22. The optical ray is reflected on the boundary, and the optical ray and the reflection generates a standing wave in the photo-resist layer 21/23. The photo-resist layer 21/23 is sensitized, and becomes soluble in the developing solution. The standing wave strongly affects the sensitization, and varies the soluble regions of the photo-resist layer 21/23.

Figure 3:
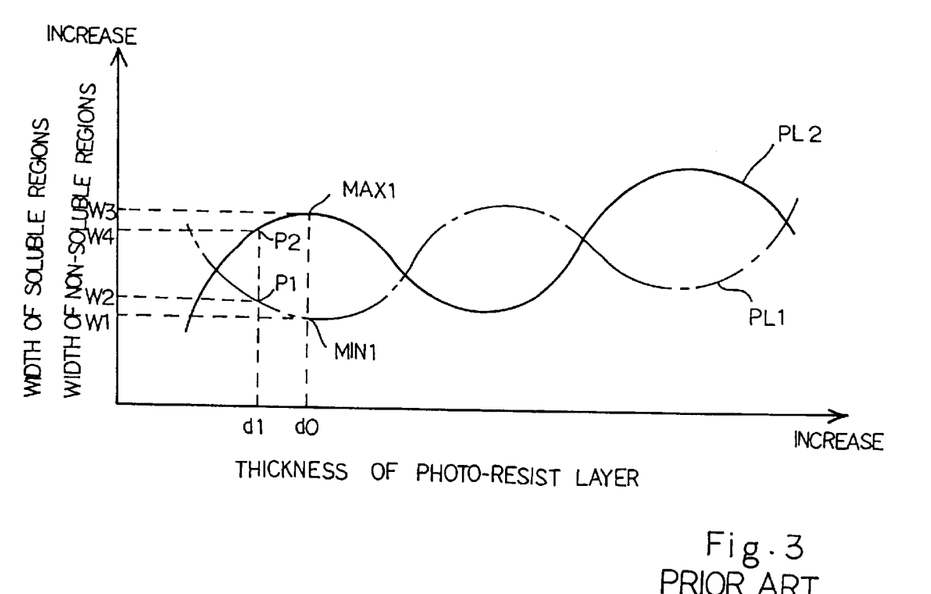
FIG. 3 is a graph showing the variation of the sensitivity of the photo-resist layer due to he standing wave.

FIG. 3 illustrates the influence of the standing wave on the sensitization. Plot PL1 is representative of the relation between the thickness of a photo-resist layer to be patterned and the width of the soluble region over a space pattern. On the other hand plot PL2 is representative of the relation between the thickness of the photo-resist layer and the width of the non-soluble region over a line pattern. Both plots PL1 and P12 are waved due to the influence of the standing wave. However, plot PL2 is 180 degrees different from plot PL1. The resist characteristics represented by plots PL1/PL2 are hereinbelow referred to as "sensitized characteristics".

When the pattern image for the node contact holes 8 is transferred to the photo resist layer 21, the soluble regions are varied along plot PL1, and define the node contact hole 8. On the other hand, when the pattern image for the storage electrodes 9 is transferred to the photo-resist layer 23, the non-soluble regions are varied along plot PL2, and define the storage electrodes 9.

In the actual fabrication process, the manufacturer designs a photo-resist layer for contact holes to have the thickness at a minimum point on plot PL1, because the contact holes surely reach a target layer in spite of deviation of the actual thickness from the target thickness. In the step for forming the node contact hole 8, the manufacturer targets the thickness d0 at the minimum point MINI. The photo-resist layer 21 over the boundary region is thinner than that over the central region, and, accordingly, the thickness d1 is unavoidably moved from the minimum point MINI to point P1 on plots PL1. As a result, the node contact hole 8 in the central region has the width W1, and the node contact hole 8 in the boundary region has the width W2. In other words, the node contact hole 8 in the boundary region is inherently wider than the contact hole 8 in the central region. The difference between the width W1 and the width W2 is of the order of 40 nanometers.

The photo-resist layer 23 is as thick as the photo-resist layer 21. The photo-resist layer 23 over the central region has the thickness d0, and the thickness d0 is located at the maximum point MAX1 on plot PL2. Therefore, the storage electrode 9 over the central region has the width W3. As described hereinbefore, the photo-resist layer 23 over the boundary region is thinner than that over the central region, and the thickness over the boundary region is moved from the maximum point MAX1 to point P2. As a result, the storage electrode 9 over the boundary region has width W4 40 nanometers less than width W3.

Figure 4:
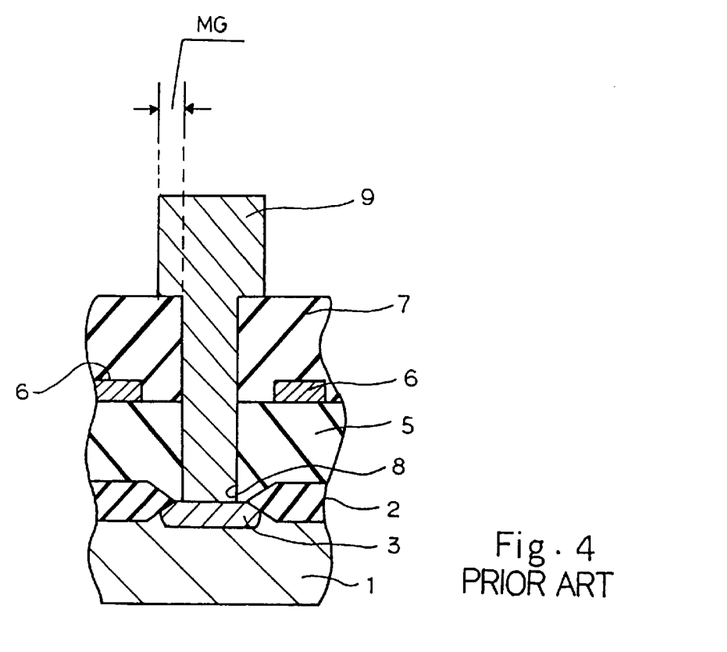
FIG. 4 is a cross sectional view showing the node contact hole plugged with the storage electrode.

Thus, even though the manufacturer appropriately designs the margin MG between the node contact hole 8 and the associated storage electrode 9, the margin is decreased over the boundary region by 40 nanometers. Although the margin MG was 250 nanometers in 4 mega-bit dynamic random access memory device, the margin MG has been reduced together with the design rules. A 16 mega-bit dynamic random access memory device is designed under 0.4 micron design rules, and the margin MG is only 40 nanometers. The difference of the margin MG between the central region and the boundary region is never ignoreable in the 16 mega-bit dynamic random access memory device, and a misalignment between the contact hole pattern and the electrode pattern results in undesirable gap between the node contact hole 8 and the storage electrode 9.

SUMMARY OF THE INVENTION

It is therefore an important object of the present invention to provide a process for fabricating a semiconductor device which does not reduce the margin between two patterns nested with each other regardless of the location on a semiconductor substrate.

To accomplish the object, the present invention proposes to make the thickness of one photo-resist layer different from another photo-resist layer by value corresponding to a half of the repetition period of plots representative of the sensitized characteristics of the photo-resist.

In accordance with one aspect of the present invention, there is provided a process for fabricating a semiconductor device comprising the steps of preparing a first semiconductor structure, spreading a photo-resist solution having sensitized characteristics having a periodicity in the presence of an optical standing wave and different in phase from each other over the first semiconductor structure so as to form a first photo-resist layer varied in thickness, exposing the first photo-resist layer to a first image carrying optical radiation varying the sensitized characteristics along one of the at least two plots so as to form a first latent image in the first photo-resist layer, developing the first latent image so that the first photo-resist layer is formed into a first photo-resist mask, carrying out a first predetermining operation on a first area of the first semiconductor structure by using the first photo-resist mask so that the first semiconductor structure is modified to a second semiconductor structure, spreading the photo-resist solution over the second semiconductor structure so as to form a second photo-resist layer varied in thickness and having a thickness different from the thickness of the first photo-resist layer by a value equivalent to at least a half of a period of the periodicity, exposing the second photo-resist layer to a second image carrying optical radiation varying the sensitized characteristics along another of the at least two plots so as to form a second latent image in the second photo-resist layer, developing the second latent image so that the second photo-resist layer is formed into a second photo-resist mask, and carrying out a second predetermining operation on a second area of the second semiconductor structure by using the second photo-resist mask, and one of the first area and the second area is nested in the other of the first area and the second area.

BRIEF DESCRIPTION OF THE DRAWINGS

The features and advantages of the process will be more clearly understood from the following description taken in conjunction with the accompanying drawings in which.

DESCRIPTION OF THE PREFERRED EMBODIMENT

FIGS. 5A to 5F illustrate a process for fabricating a semiconductor dynamic random access memory device embodying the present invention. The process starts with a p-type silicon substrate 31. A field oxide layer 32 is selectively grown to 400 nanometers thick on the major surface of the p-type silicon substrate 31, and defines active areas. The active areas are selectively assigned to memory cells and circuit components of peripheral circuits. The active areas assigned to the memory cells are in a central region 31a and a boundary region 31b between the central region 31a and the area assigned to the peripheral circuits.

The active areas assigned to the memory cells are thermally oxidized, and gate oxide layers are grown on the active areas. Gate electrodes are patterned on the gate oxide layers, and n-type dopant impurity is ion implanted into the active areas in a self-aligned manner with the gate electrodes. The n-type dopant impurity forms a pair of source regions 33 and a drain region in each active area. FIGS. 5A to 5F show semiconductor structures at different steps along a cross section perpendicular to the source region 33. For this reason, the gate oxide layer, the gate electrode and the drain region are not shown in FIGS. 5A to 5F. The gate oxide layer, the gate electrode, the source region 33 and the drain region as a whole constitute an n-channel enhancement type access transistor 44 of each memory cell.

Figure 5A:
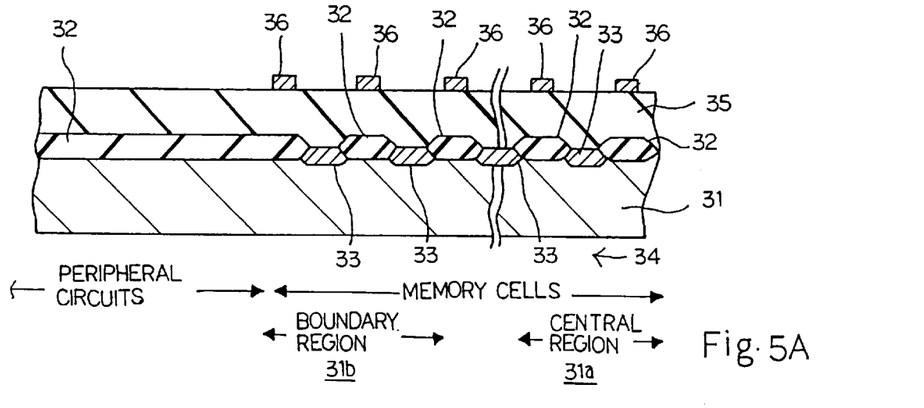
FIGS. 5A to 5F are cross sectional views showing a process for fabricating a semiconductor device according to the present invention.

Subsequently, boro-phospho-silicate glass is deposited to 500 nanometers thick over the entire surface of the resultant semiconductor structure, and bit contact holes (not shown) are formed in the boro-phospho-silicate glass layer 35 by using photo-lithographic techniques and an etching. The drain regions are exposed to the bit contact holes, respectively. Tungsten silicide is deposited over the entire surface of the resultant semiconductor structure. The tungsten silicide fills the bit contact holes, and forms a tungsten silicide layer on the boro-phospho-silicate glass layer 35. The tungsten silicide layer is selectively etched away, and bit lines 36 are patterned on the boro-phospho-silicate glass layer 35 as shown in FIG. 5A.

Figure 5B:
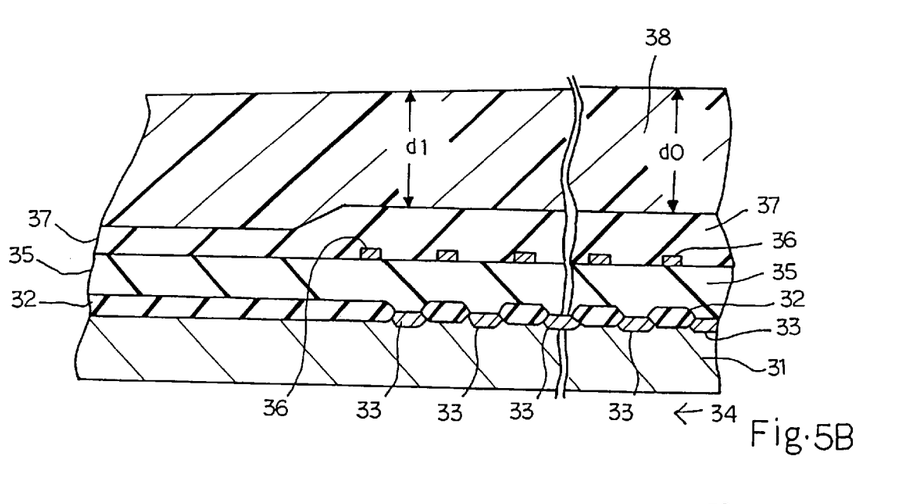

Subsequently, boro-phospho-silicate glass is deposited over the entire surface of the resultant semiconductor structure, and forms a boro-phospho-silicate glass layer 37 of 500 nanometers thick. After the deposition of the boro-phospho-silicate glass layer 37, photo-resist solution is spun onto the boro-phospho-silicate glass layer 37, and is baked so that the boro-phospho-silicate glass layer 37 is covered with a photo-resist layer 38 as shown in FIG. 5B. The average thickness of the photo-resist layer 38 is 1 micron. However, the thickness of the photo-resist layer 38 is not constant. The photo-resist layer 38 over the central region 31a is thicker than the photo-resist layer 38 over the boundary region 31b. The photo-resist layer 38 over the central region 31a is adjusted to d0, and the thickness d0 is 20 nanometers greater than the thickness d1 over the boundary region 3b.

The p-type silicon substrate 31 is placed on an x-y stage of an aligner (not shown), and is exposed to optical radiation through a photo mask (not shown). A pattern image for node contact holes 39 are transferred from the photo-mask to the photo-resist layer 38, and a latent image for the node contact holes 39 is formed in the photo-resist layer 38. The latent image is defined by the boundary between a non-soluble region and soluble regions. The photo-resist layer 38 is a positive type, and becomes partially soluble. In other words, the portions exposed to the optical radiation become soluble in developing solution.

Figure 6:
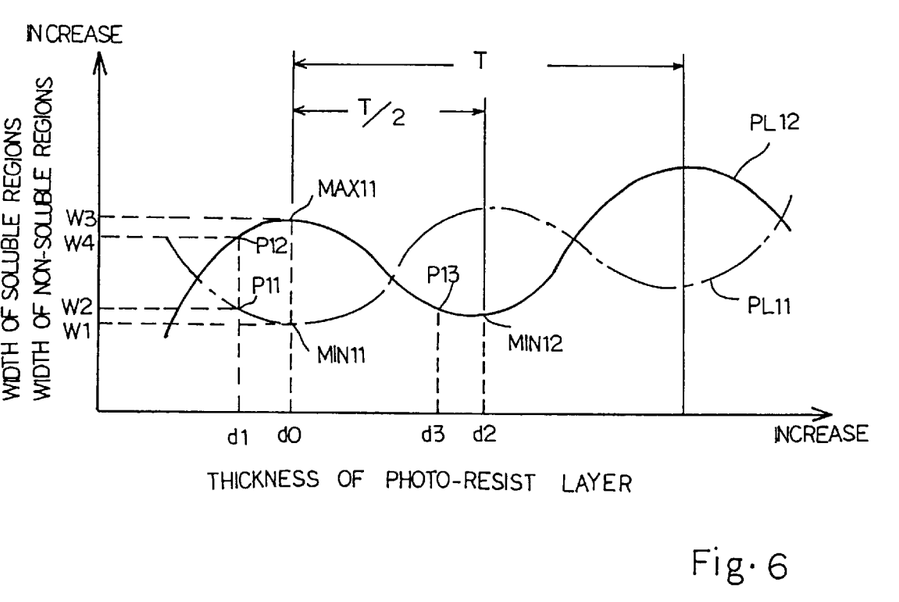
FIG. 6 is a graph showing sensitized characteristics of a kind of photo-resist used in the process.

The photo-resist has sensitized characteristics in the presence of an optical standing wave, and are indicated by plots PL11 and PL12 (see FIG. 6). If the photo-resist is used for a photo-resist mask for a space pattern such as miniature contact holes, the manufacturer uses the sensitized characteristics indicated by plot PL11. On the other hand, when the photo-resist is used for a photo-mask for a line pattern such as miniature electrodes, the manufacturer uses the sensitized characteristics indicated by plot PL12. The reason why plot PL11 is used for the contact holes is same as that described in conjunction with the prior art process.

The thickness d0 is adjusted to the minimum point MIN11 on plot PL11, and the photo-resist layer 38 has soluble portions over the central region 31a. The width of the soluble portions is W1. The thickness d1 is less than the thickness d0, and is located at point P11 on plot PL11. For this reason, soluble portions over the boundary region 31b has width W2. Width W2 is greater than width W1.

Figure 5C:
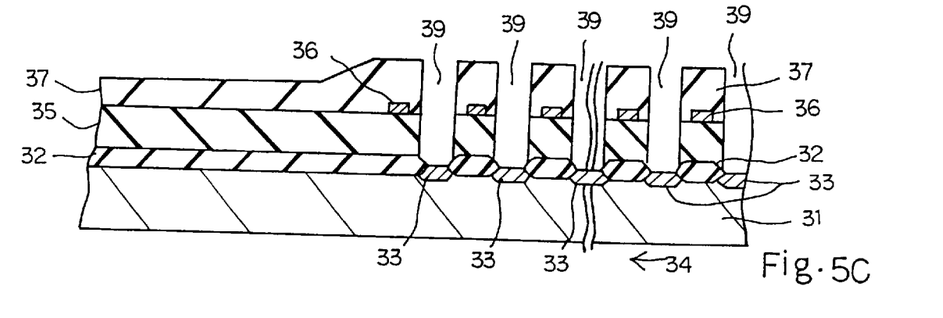

The latent image is developed, and the photo-resist layer 38 is patterned into a photo-resist etching mask (not shown) through the development. The photo-resist etching mask has openings, and the boro-phospho-silicate glass layers 35/37 over the source regions 33 are exposed to the openings formed in the photo-resist etching mask. Using the photo-resist etching mask, the boro-phospho-silicate glass layers 37/35 are selectively etched away, and the node contact holes 39 are formed in the boro-phospho-silicate glass layers 35/37 as shown in FIG. 5C. In this instance, the node contact holes 39 are 0.4 micron in diameter. The photo-resist etching mask for the node contact holes 39 are stripped off.

Figure 5D:
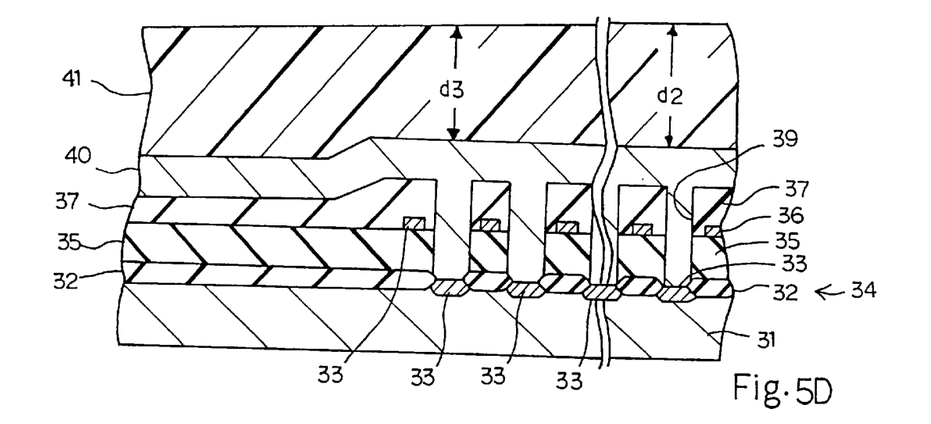

The photo-lithographic techniques and the etching technique are also required for the storage electrodes 9. Polysilicon is deposited over the entire surface of the resultant semiconductor structure shown in FIG. 5C. The polysilicon fills the node contact holes 39, and forms a polysilicon layer 40 of 500 nanometers thick. Photo-resist solution is spun onto the polysilicon layer 40, and is baked so that a photo-resist layer 41 of 1 micron thick covers the polysilicon layer 40 as shown in FIG. 5D.

The thickness of the photo-resist layer 41 is also not constant. The photo-resist layer 41 over the central region is thicker than the photo-resist layer 41 over the boundary region. The photo-resist solution is spread over the polysilicon layer 40 by using a spinner. The following factors affect the thickness of the photo-resist layers 38/41. The factors are the rotation of the spinner, the viscosity of the photo-resist, the solid containing percentage and the amount of photo-resist solution dropped onto the semiconductor structure. The photo-resist layer 41 has thickness d2 over the central region 31a and thickness d3 over the boundary region 31b. The thickness d2 is assumed to be 20 nanometers greater than the thickness d3.

Plots PL11/PL12 are repeated at repetition period T. The photo-resist layer 41 over the central region 31a is thicker than the photo-resist layer 38 over the central region 31a by a half of the repetition period T, i.e. T/2 (see FIG. 6), and, accordingly, the thickness d2 is on the next minimum point MIN12 on plot PL12. As a result, the photo-resist layer 41 over the boundary region is located at point P13 on plot PL11.

The p-type silicon substrate 31 is placed on the x-y stage of the aligner (not shown), and is exposed to optical radiation through a photo mask (not shown). A pattern image for the storage electrodes 42 are transferred from the photomask to the photo-resist layer 41, and a latent image for the storage electrodes 42 is formed in the photo-resist layer 41. The latent image is defined by the boundary between a soluble region exposed to the optical radiation and the non-soluble regions prevented from the optical radiation. The thickness d3 results in the non-soluble regions over the boundary region 3b wider than the non-soluble regions over the central region 31a, and the tendency of the latent image for the storage electrodes 42 is similar to that of the latent image for the node contact holes 39.

Figure 5E:
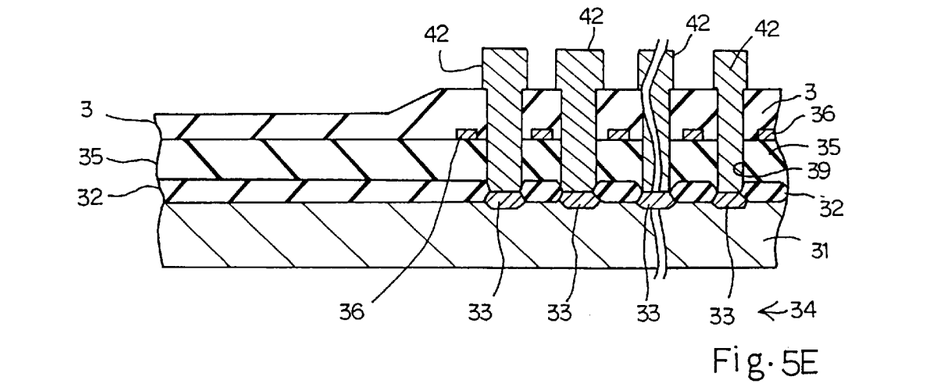

The latent image is developed, and the photo-resist layer 41 is patterned into a photo-resist etching mask (not shown) through the development. Using the photo-resist etching mask, the polysilicon layer 40 is selectively etched away, and the storage electrodes 42 are formed in the node contact holes 39 as shown in FIG. 5E. The storage electrodes 42 are held in contact with the source regions 33 of the n-channel enhancement type access transistors 34. The storage electrodes 42 over the boundary region 31b are wider than the storage electrodes 42 over the central region 31a by 40 nanometers. Although the node contact holes 39 over the boundary region 31b is wider than the node contact holes 39 over the central region 31a, any gap does not take place between the node contact holes 39 and the storage electrodes 42, and the margin MG (see FIG. 4) is constant over the area assigned to the memory cells.

Subsequently, silicon nitride is deposited to 7 nanometers thick over the entire surface of the resultant semiconductor structure, and the storage electrodes 42 are covered with dielectric layers 43 of the silicon nitride.

Figure 5F:
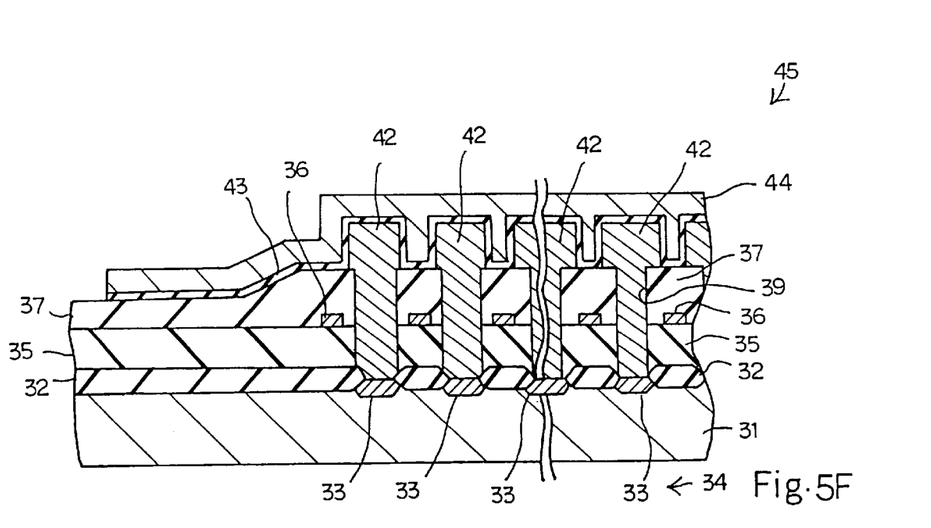

Finally, polysilicon is deposited to 200 nanometers thick over the entire surface of the resultant semiconductor structure, and forms a polysilicon layer. The polysilicon layer is pattered by using the photo-lithographic techniques and the etching, and a counter electrode 44 is left on the dielectric layers 43. The storage electrode 42, the dielectric layer 43 and the counter electrode 44 form in combination each stacked capacitor 45, and the stacked capacitor 45 is connected is series to the n-channel enhancement type access transistor 34. The stacked capacitor 45 and the n-channel enhancement type access transistor 34 form in combination each memory cell.

In the abode described embodiment, plots PL11/PL12 are corresponding to at least two plots, and the photo-resist layers 38/41 serve as a first photo-resist layer and a second photo-resist layer, respectively.

As will be appreciated from the foregoing description, even though the photo-resist layers 38/41 are decreased in thickness, the difference in thickness between the photoresist layer 38 and the photo-resist layer 41 gives the same tendency to the pattern of node contact holes 39 and the pattern of the storage electrodes 42, and the storage electrodes 42 are snugly received in the node contact holes 39 over the area assigned to the memory cells.

Although a particular embodiments of the present invention has been shown and described, it will be apparent to those skilled in the art that various changes and modifications may be made without departing from the spirit and scope of the present invention.

For example, the present invention is applicable to a photo-lithography used for any combination of a line pattern and a space pattern nested with one another. Moreover, the semiconductor device is never limited to the dynamic random access memory device. The present invention is applicable to any kind of semiconductor integrated circuit device.

The minimum point MIN12 is not limited to the same period as the maximum point MXA11. The difference between the minimum points MIN11 and MIN12 is expressed as $(n+(1/2))$ period where n is an integer.

What is claimed is:

1. A process for fabricating a semiconductor device, comprising the steps in sequence of:
   a) preparing a first semiconductor structure;
   b) spreading a photo-resist solution having sensitized characteristics represented by at least two plots having a periodicity in the presence of an optical standing wave and different in phase from each other over said first semiconductor structure so as to form a first photo-resist layer varied in thickness;
   c) exposing said first photo-resist layer to a first image carrying optical radiation varying said sensitized characteristics along one of said at least two plots so as to form a first latent image in said first photo-resist layer;
   d) developing said first latent image so that said first photo-resist layer is formed into a first photo-resist mask;
   e) carrying out a first predetermining operation on a first area of said first semiconductor structure by using said first photo-resist mask so that said first semiconductor structure is modified to a second semiconductor structure;
   f) spreading said photo-resist solution over said second semiconductor structure so as to form a second photo-resist layer varied in thickness and having a thickness different from the thickness of said first photo-resist layer by a value equivalent to at least a half of a period of said periodicity;
   g) exposing said second photo-resist layer to a second image carrying optical radiation varying said sensitized characteristics along another of said at least two plots so as to form a second latent image in said second photo-resist layer;
   h) developing said second latent image so that said second photo-resist layer is formed into a second photo-resist mask; and
   i) carrying out a second predetermining operation on a second area of said second semiconductor structure by using said second photo-resist mask, one of said first area and said second area being nested in the other of said first area and said second area.

2. The process as set forth in claim 1, in which said first photo-resist layer is spread over an inter-level insulating structure incorporated in said first semi-conductor structure in said step b), and said first predetermined operation is an etching operation in which holes are formed in said inter-level insulating structure.

3. The process as set forth in claim 2, in which said holes penetrate said inter-level insulating structure so that impurity regions of circuit components are exposed to said holes.

4. The process as set forth in claim 3, in which said step e) includes the substeps of e-1) selectively etching said inter-level insulating structure so as to form said holes, e-2) removing said first photo-resist mask; and e-3) depositing conductive material over the resultant semiconductor structure so that said second semiconductor structure includes a conductive layer of said conductive material formed on said inter-level insulating structure.

5. The process as set forth in claim 4, in which said second photo-resist layer is formed on said conductive layer in said step f), and said second predetermined operation in said step i) is an etching operation in which conductive strips are formed from said conductive layer.

6. The process as set forth in claim 5, in which said holes and said conductive strips are contact holes and electrodes.

7. The process as set forth in claim 6, in which said contact holes are node contact holes, and said electrodes form storage capacitors together with dielectric layers and counter electrodes.

8. The process as set forth in claim 1, in which said at least a half of said period is expressed by $\{n+(½)\}T$ where n is an integer and T is said period.

* * * * *